United States Patent
Kimoto et al.

(10) Patent No.: US 12,119,314 B2
(45) Date of Patent: Oct. 15, 2024

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Nobuyoshi Kimoto, Fukuoka (JP); Tadatsugu Yamamoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 514 days.

(21) Appl. No.: 17/283,936

(22) PCT Filed: Feb. 28, 2019

(86) PCT No.: PCT/JP2019/007880
§ 371 (c)(1),
(2) Date: Apr. 8, 2021

(87) PCT Pub. No.: WO2020/174670
PCT Pub. Date: Sep. 3, 2020

(65) Prior Publication Data
US 2021/0398927 A1    Dec. 23, 2021

(51) Int. Cl.
*H01L 23/00*    (2006.01)
(52) U.S. Cl.
CPC .............. *H01L 24/05* (2013.01); *H01L 24/03* (2013.01); *H01L 2224/039* (2013.01);
(Continued)
(58) Field of Classification Search
None
See application file for complete search history.

(56) References Cited

U.S. PATENT DOCUMENTS

| 5,656,863 A * | 8/1997 | Yasunaga | H01L 21/565 257/E23.021 |
| 7,759,803 B2 * | 7/2010 | Nakatani | H01L 24/48 257/781 |

(Continued)

FOREIGN PATENT DOCUMENTS

| JP | 2005-268442 | * | 3/2004 |
| JP | 2006-294761 | * | 4/2005 |

(Continued)

OTHER PUBLICATIONS

An Office Action; "Notice of Reasons for Refusal", mailed by the Japanese Patent Office on Feb. 8, 2022, which corresponds to Japanese Patent Application No. 2021-501505 and is related to U.S. Appl. No. 17/283,936; with English language translation.

(Continued)

*Primary Examiner* — Nishath Yasmeen
(74) *Attorney, Agent, or Firm* — Studebaker & Brackett PC

(57) ABSTRACT

A semiconductor device according to the present disclosure includes a semiconductor substrate, a first electrode provided on the semiconductor substrate, an insulating layer including a first part provided on an upper surface of the first electrode, a second electrode including a main portion and an eaves portion, the main portion being provided on the upper surface of the first electrode, the eaves portion extending over the first part and solder covering an upper surface of the main portion and a part of an upper surface of the eaves portion wherein the insulating layer includes a second part covering a part of the upper surface of the eaves portion, the part being closer to an end portion of the eaves portion than the part covered by the solder and a third part connecting the first part and the second part and covering the end portion of the eaves portion.

16 Claims, 5 Drawing Sheets

(52) U.S. Cl.
CPC ............... *H01L 2224/05017* (2013.01); *H01L 2224/05082* (2013.01); *H01L 2224/05083* (2013.01); *H01L 2224/05084* (2013.01); *H01L 2224/05124* (2013.01); *H01L 2224/05155* (2013.01); *H01L 2224/0566* (2013.01); *H01L 2924/35121* (2013.01)

(56) References Cited

U.S. PATENT DOCUMENTS

| | | | | |
|---|---|---|---|---|
| 7,906,424 | B2* | 3/2011 | Topacio | H01L 24/13 257/E21.508 |
| 2003/0034550 | A1* | 2/2003 | Nakatani | H01L 24/03 257/E23.002 |
| 2006/0131685 | A1 | 6/2006 | Watanabe et al. | |
| 2007/0102815 | A1* | 5/2007 | Kaufmann | H01L 24/11 257/737 |
| 2008/0304530 | A1* | 12/2008 | Morizumi | H01S 5/028 372/49.01 |
| 2009/0194889 | A1* | 8/2009 | Jeng | H01L 24/03 257/786 |
| 2016/0218262 | A1* | 7/2016 | Aketa | H01L 33/486 |
| 2016/0343924 | A1* | 11/2016 | Williams | H01L 33/382 |

FOREIGN PATENT DOCUMENTS

| | | | | |
|---|---|---|---|---|
| JP | 2005268442 | A * | 9/2005 | ............. H01L 24/11 |
| JP | 2006-173437 | A | 6/2006 | |
| JP | 2006294761 | A * | 10/2006 | ............. H01L 24/03 |
| JP | 2007-027308 | A | 2/2007 | |
| JP | 6406975 | | * 10/2014 | |
| JP | 2017084911 | | * 10/2015 | |
| JP | 2016-086069 | A | 5/2016 | |
| JP | 2016-111290 | A | 6/2016 | |
| JP | 2017084911 | A * | 5/2017 | |
| JP | 6249933 | B2 * | 12/2017 | |
| JP | 2018-046151 | A | 3/2018 | |
| JP | 2018-137290 | A | 8/2018 | |
| JP | 6406975 | B2 * | 10/2018 | |

OTHER PUBLICATIONS

Arthur Keigler et al., "PVD Processing for Flip Chip: Considering Adhesion Layer Properties", Advanced Packaging, Oct. 2007, p. 20.
An Office Action issued by the German Patent and Trade Mark Office on Nov. 3, 2022, which corresponds to German Patent Application No. 112019006936.5 and is related to U.S. Appl. No. 17/283,936; with English language translation.
An Office Action mailed by China National Intellectual Property Administration on Nov. 30, 2023, which corresponds to Chinese Patent Application No. 201980092814.3 and is related to U.S. Appl. No. 17/283,936; with English language translation.
International Search Report; Written Opinion; and Notification of Transmittal of the International Search Report and the Written Opinion of the International Searching Authority, or the Declaration issued in PCT/JP2019/007880; mailed May 14, 2019.

* cited by examiner

SEMICONDUCTOR DEVICE AND METHOD FOR MANUFACTURING SEMICONDUCTOR DEVICE

FIELD

The present invention relates to a semiconductor device and a method for manufacturing the semiconductor device.

BACKGROUND

In PTL 1, a semiconductor device is disclosed which includes a semiconductor substrate, a first AlSi layer that covers at least a part of a surface of the semiconductor substrate, and a polyimide film that covers a part of a surface of the first AlSi layer. This semiconductor device further includes a second AlSi layer that covers at least a part of a surface of the polyimide film and extends from above the polyimide film to the first AlSi layer in a range not covered with the polyimide film. In addition, a range stretching over a surface of the first AlSi layer in the range not covered with the polyimide film and a surface of the second AlSi layer is covered by a nickel layer. An upper surface of the nickel layer is bonded to a solder layer.

CITATION LIST

Patent Literature

[PTL 1] JP 2018-46151 A

SUMMARY

Technical Problem

In the semiconductor device of PTL 1, when the positions of a solder end portion and an Ni film end portion coincide, a stress of peeling off the Ni film starting from an end tends to occur. In this case, since adhesion between metal and resin is generally low, peeling off at the interface between the nickel layer and the polyimide film occasionally occurs. In addition, a crack may develop from where the aluminum film starts to peel off.

The present invention has been made in order to solve the above-mentioned problem and it is an object of the present invention to provide a semiconductor device achieving a long life and a manufacturing method for the semiconductor device.

Solution to Problem

A semiconductor device according to the invention of the present application includes a semiconductor substrate, a first electrode provided on the semiconductor substrate, an insulating layer including a first part provided on an upper surface of the first electrode, a second electrode including a main portion and an eaves portion, the main portion being provided on the upper surface of the first electrode, the eaves portion being connected to the main portion and extending over the first part and solder covering an upper surface of the main portion and a part of an upper surface of the eaves portion connected with the upper surface of the main portion of the second electrode wherein the insulating layer includes a second part covering a part of the upper surface of the eaves portion, the part being closer to an end portion of the eaves portion than the part covered by the solder and a third part connecting the first part and the second part and covering the end portion of the eaves portion.

A semiconductor device according to the invention of the present application includes a semiconductor substrate, a first electrode provided on the semiconductor substrate, an insulating layer provided on an upper surface of the first electrode, a second electrode including a main portion and an eaves portion, the main portion being provided on the upper surface of the first electrode, the eaves portion being connected to the main portion and extending over the insulating layer, solder covering an upper surface of the main portion and a part of an upper surface of the eaves portion connected with the upper surface of the main portion of the second electrode and a conductive film covering a part of the upper surface of the eaves portion, the part being closer to an end portion of the eaves portion than the part covered by the solder, the conductive film on which it is harder for the solder to wet and spread than on the second electrode.

A manufacturing method for a semiconductor device according to the invention of the present application includes a step of forming a first electrode on a semiconductor substrate, a step of forming a first insulating layer on an upper surface of the first electrode, an electrode forming step of forming a second electrode over from an upper surface of the first electrode to an upper surface of the first insulating layer, a step of forming a second insulating layer on the first insulating layer so as to cover an end portion of an eaves portion of the second electrode, the eaves portion extending over the first insulating layer, and a part of an upper surface of the eaves portion, the part being connected to the end portion and a step of forming solder so as to cover an upper surface of a main portion of the second electrode, the main portion being a part provided on the upper surface of the first electrode, and a part of the upper surface of the eaves portion, the part being closer to the main portion than the part covered by the second insulating layer.

Advantageous Effects of Invention

In the semiconductor device according to the invention, the position of the end portion of the solder and the position of an end portion of the second electrode do not coincide due to the second part of the insulating layer or a conductive film. Therefore, a crack is hard to develop to the second electrode. In addition, even in a case where a brittle fracture has occurred in the second electrode, since an insulating layer is provided directly under the end portion of the solder, a crack generation in the first electrode can be prevented. Thus, the long life of the semiconductor device can be achieved.

In the manufacturing method for the semiconductor device according to the invention, the position of the end portion of the solder and the position of the end portion of the second electrode do not coincide due to the second part of the insulating layer. Therefore, a crack is hard to develop to the second electrode. In addition, even in a case where a brittle fracture has occurred in the second electrode, since an insulating layer is provided directly under the end portion of the solder, a crack generation in the first electrode can be prevented. Thus, the long life of the semiconductor device can be achieved.

DESCRIPTION OF EMBODIMENTS

Figure 1:
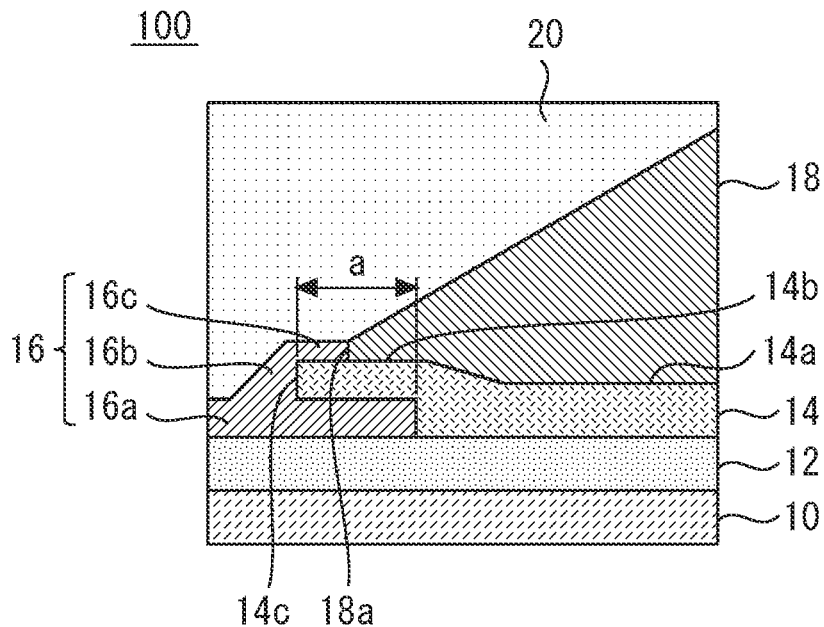
FIG. 1 is a cross-sectional view of a semiconductor device according a first embodiment.

A semiconductor device and a method for manufacturing the semiconductor device according to embodiments of the present invention are described with reference to drawings. Identical or corresponding constitutional elements are given the same reference numerals, and the repeated description of such constitutional elements may be omitted.

First Embodiment

FIG. 1 is a cross-sectional view of a semiconductor device 100 according a first embodiment. The semiconductor device 100 is used for power control, for example. The semiconductor device 100 is a switching device such as an insulated gate bipolar transistor (IGBT), for example. In addition, the semiconductor device 100 may be a metal oxide semiconductor field effect transistor (MOSFET).

The semiconductor device 100 includes a semiconductor substrate 10. The semiconductor substrate 10 is made with, for example. Si. On the semiconductor substrate 10, a first electrode 12 is provided. The first electrode 12 is made with, for example, Al. The first electrode 12 is, for example, an emitter electrode.

On an upper surface of the first electrode 12, a second electrode 14 and an insulating layer 16 are provided. The insulating layer 16 is made with, for example, polyimide. The second electrode 14 is made with, for example, Ni. The second electrode 14 is provided to improve bondability with solder 18.

The insulating layer 16 includes a first part 16a that is provided on an upper surface of the first electrode 12. The second electrode 14 includes a main portion 14a that is provided on the upper surface of the first electrode 12. In addition, the second electrode 14 includes an eaves portion 14b that is connected to the main portion 14a and extends over the first part 16a. On an upper surface of the second electrode 14, the solder 18 is provided. The solder 18 covers an upper surface of the main portion 14a of the second electrode 14 and a part of an upper surface of the eaves portion 14b which is connected with the upper surface of the main portion 14a.

The insulating layer 16 includes a second part 16c that covers a part of the upper surface of the eaves portion 14b. The second part 16c covers a part of the upper surface of the eaves portion 14b, the part being closer to the end portion 14c of the eaves portion 14b than the part covered by the solder 18. An end portion of the second part 16c and an end portion 18a of the solder 18 are in contact with each other. In addition, the insulating layer 16 includes a third part 16b that connects the first part 16a and the second part 16c. The third part 16b covers the end portion 14c of the eaves portion 14b.

In the present embodiment, the second electrode 14 in a peripheral portion of the solder 18 is formed to straddle the insulating layer 16. An upper surface, a lower surface and an end surface that connects the upper surface and the lower surface of the eaves portion 14b of the second electrode 14 are covered by the insulating layer 16. The end surface of the eaves portion 14b corresponds to the end portion 14c. A length of the second part 16c from the end portion 14c of the eaves portion 14b is shorter than a length of the first part 16a from the end portion 14c of the eaves portion 14b. In this case, the end portion 18a of the solder 18 is positioned in an area indicated by a range a. The area indicated by the range a is an area between the end portion 14c of the second electrode 14 and an end portion of the first part 16a.

Figure 2:
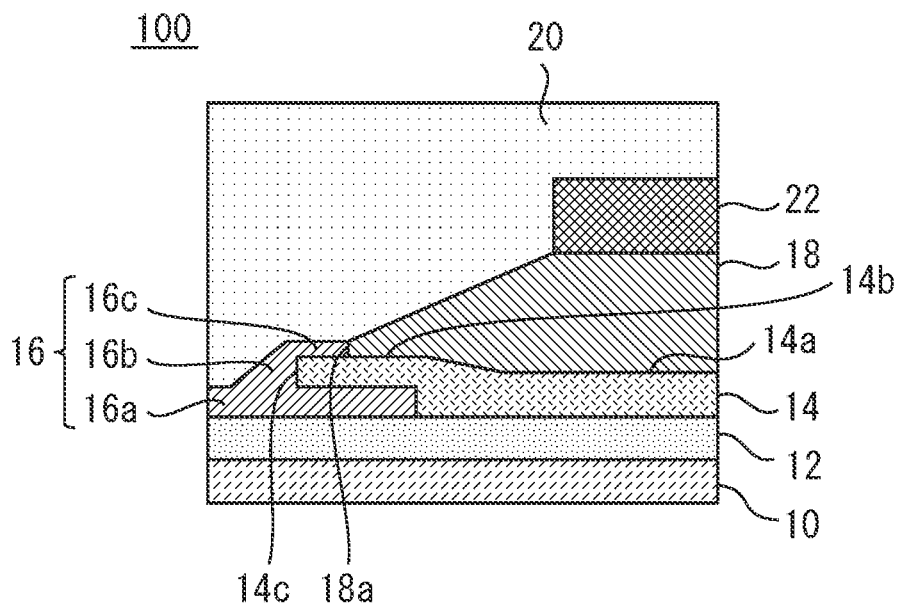
FIG. 2 is a view illustrating a state in which an external electrode is provided on the semiconductor device according to the first embodiment.

FIG. 2 is a view illustrating a state in which an external electrode 22 is provided on the semiconductor device 100 according to the first embodiment. The solder 18 directly bonds the second electrode 14 and the external electrode 22. The external electrode 22 is made with, for example, copper. In addition, the semiconductor device 100 is sealed by a mold resin 20. The insulating layer 16, the solder 18, and the external electrode 22 are covered by the mold resin 20.

Figure 3:
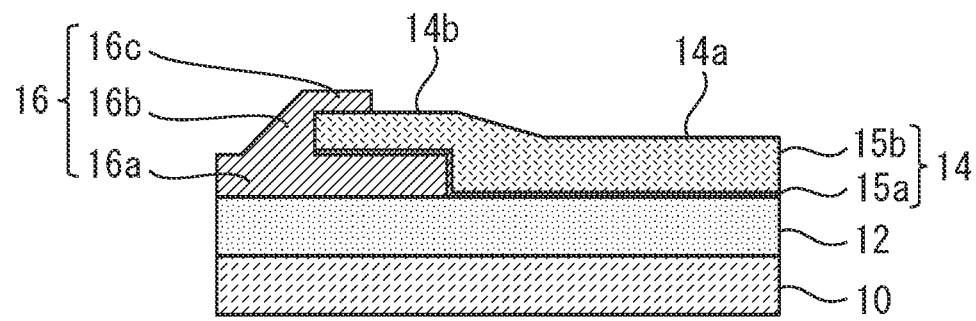
FIG. 3 is a view describing a structure of the second electrode according to the first embodiment.

FIG. 3 is a view describing a structure of the second electrode 14 according to the first embodiment. In FIG. 3, the solder 18, the external electrode 22, and the mold resin 20 are omitted. The second electrode 14 includes a Ti film 15a that is provided on an upper surface of the first electrode 12 and an Ni film 15b that is provided on an upper surface of the Ti film 15a. The second electrode 14 is a front metal that is positioned closer to a front surface than the first electrode 12. The second electrode 14 forms an appropriate compound film with the solder 18. In addition, the second electrode 14 functions as a barrier against excessive erosion by the solder 18. The excessive erosion is also called Ni erosion.

The Ti film 15a improves adhesion between the first electrode 12 that is an Al film and the Ni film 15b. In addition, on an upper surface of the Ni film 15b, an Au film may be further provided. By providing an Au film on an outermost surface of the second electrode 14, oxidation of the metal films can be prevented. Thus, wettability of the solder 18 can be ensured. Note that the Au film diffuses into the solder 18 at the time of soldering. Therefore, the Au film does not remain on a bonding interface after soldering in many cases.

In addition, on a rear surface of the semiconductor substrate 10, a back metal may be provided. The back metal is made with Ti/Ni/Au films as with the front metal. The back metal is provided also for bonding with solder. In addition, also by using an Mo film instead of the Ti film 15a, the same function can be obtained.

An example of thickness of each layer will be given. 0.5 to 2.0 µm for the Ni film 15b, 0.05 to 0.2 µm for the Ti film 15a, 3.0 to 5.0 µm for the first electrode 12 that is an Al film, and 0.03 to 0.2 µm for the Au film. In addition, 2 to 20 µm for the insulating layer 16 that is a coating film formed from polyimide.

In the present embodiment, the Ni film 15b is formed as a single layer and has a stepped structure. As the Ni film 15b is a single layer in the present embodiment, it is formed by one process. Thus, a film quality can be made uniform. In addition, an in-layer peeling due to a thermal stress, for example, is hard to occur and durability is excellent.

Figure 4:
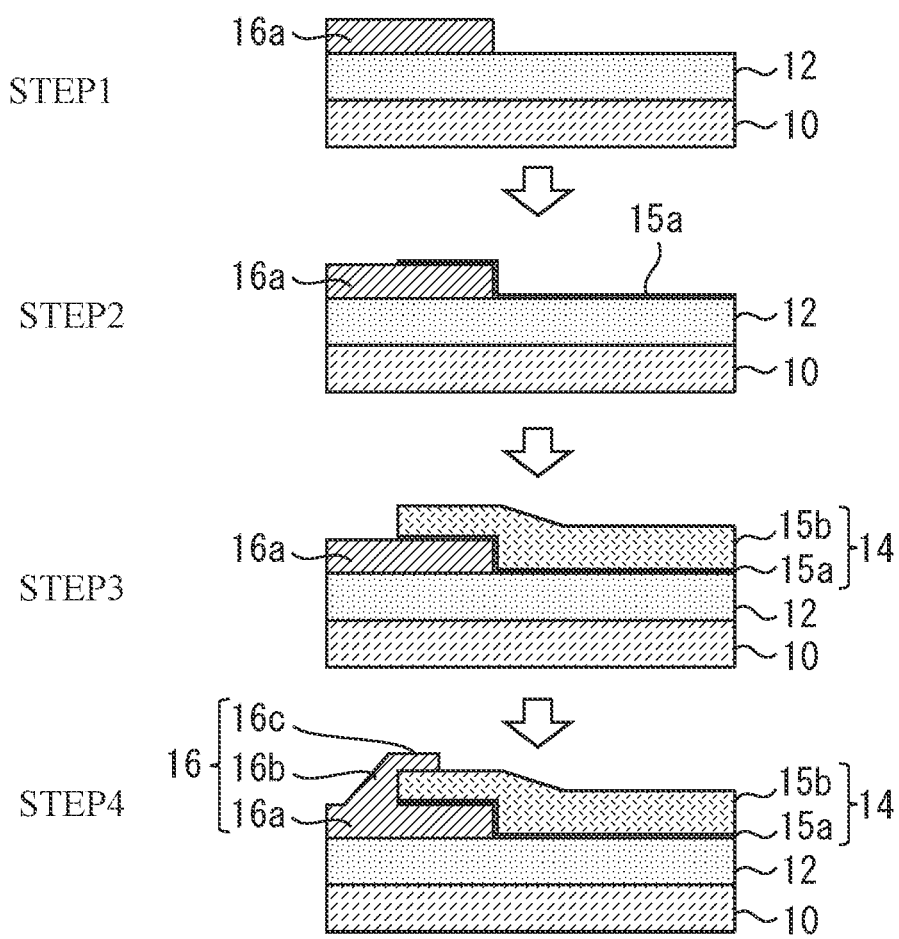
FIG. 4 is a view for describing a manufacturing method for the semiconductor device according to the first embodiment.

Next, a manufacturing method for the semiconductor device 100 will be described. FIG. 4 is a view for describing a manufacturing method for the semiconductor device according to the first embodiment. First, the first electrode 12 is formed on the semiconductor substrate 10. Next, a first insulating layer is formed on the upper surface of the first electrode 12 (step 1). Here, the first insulating layer corresponds to the first part 16*a*.

Next, an electrode forming step is performed. In the electrode forming step, first, the Ti film 15*a* is formed on the upper surface of the first electrode 12 by sputtering so as to stretch over the first part 16*a* and the first electrode 12 (step 2). Thus, the Ti film 15*a* is formed in a stepped shape in an electrode peripheral portion. Next, the Ni film 15*b* is formed on the upper surface of the Ti film 15*a* by sputtering (step 3). Thus, the second electrode 14 is formed over from the upper surface of the first electrode 12 to the upper surface of the first part 16*a*.

Next, polyimide is applied on a peripheral portion of the Ni film 15*b* (step 4). Thus, a second insulating layer is formed on the first insulating layer. The second insulating layer corresponds to the second part 16*c* and the third part 16*b*. The end portion 14*c* of the eaves portion 14*b* and a part of the upper surface of the eaves portion 14*b*, the part being connected to the end portion 14*c*, are covered by the second insulating layer.

Next, the solder 18 is formed on the upper surface of the second electrode 14. The solder 18 is formed so as to cover the upper surface of the main portion 14*a* and a part of the upper surface of the eaves portion 14*b*, the part being closer to the main portion 14*a* than the part covered by the second insulating layer. Next, the external electrode 22 and the second electrode 14 are bonded by the solder 18. After that, the semiconductor device 100 is sealed by the mold resin 20.

In the present embodiment, the Ni film 15*b* is formed by sputtering once. Therefore, a reduction in assembly man hours can be achieved.

Next, effects of the present embodiment will be described. In general, in a semiconductor device, a stress tends to be concentrated at a solder end portion due to a thermal cycle of the device itself. This occurs, for example, due to a difference in a linear expansion coefficient of each constituent member. This may cause a crack to be generated on an electrode such as an emitter electrode. Especially on an Ni plating film, a brittle fracture tends to occur due to a thermal stress. In this case, the crack may develop to an underlying Al film.

On the other hand, in the semiconductor device 100 of the present embodiment, the position of the end portion 18*a* of the solder 18 on the upper surface of the second electrode 14 is determined by the second part 16*c* of the insulating layer 16. In short, the second part 16*c* limits the range of wetting and spreading of the solder 18. Therefore, the position of the end portion 18*a* of the solder 18 and the position of the end portion 14*c* of the second electrode 14 do not coincide. Thus, even when a crack occurs in the solder 18, the crack is hard to develop to the second electrode 14.

In addition, the first part 16*a* is provided directly under the end portion 18*a* of the solder 18 on the eaves portion 14*b*, with the second electrode 14 being interposed between the first part 16*a* and the end portion 18*a*. Therefore, even when the second electrode 14 causes a brittle fracture to occur due to variations in film qualities, a crack can be prevented from occurring in the first electrode 12. Thus, the first electrode 12 is protected and the long life of the semiconductor device 100 can be achieved. In addition, in the present embodiment, a product life can be appropriately designed and uniformization of the product life can be achieved.

Furthermore, when a solder bonding area is expanded to outside of an active area, a solder bridge that lies astride a guard ring of a peripheral portion may occur. In this case, there is a possibility that a device withstand voltage drops. On the other hand, a bonding area by the solder 18 of the present embodiment stays within an active region through which a main current of the semiconductor device 100 flows. In short, the second electrode 14, the insulating layer 16, and the solder 18 are provided on or above the first electrode 12 that is a main electrode of the semiconductor device 100. Thus, a device withstand voltage drop can be avoided.

In addition, when the positions of a solder end portion and an Ni film end portion coincide, a stress of peeling off the Ni film starting from an end portion tends to occur. On the other hand, in the present embodiment, the position of the end portion 18*a* of the solder 18 and the position of the end portion 14*c* of the second electrode 14 do not coincide with each other. Thus, peeling-off between the second electrode 14 and the insulating layer 16 can be prevented. In addition, development of a crack to the first electrode 12 starting from a peeling-off portion can be prevented. Furthermore, in the insulating layer 16, the first part 16*a* and the second part 16*c* are connected by the third part 16*b*. Thus, the end portion 14*c* of the second electrode 14 is held by the insulating layer 16. Thus, peeling-off between the second electrode 14 and the insulating layer 16 can be further prevented.

In addition, materials of the layers are not limited to the above-described ones. For example, the second electrode 14 is not limited to Ni and it is only required to be made with a material that allows solder to more easily wet and spread than the first electrode 12.

The semiconductor substrate 10 may be made with a wide band gap semiconductor. The wide band gap semiconductor is silicon carbide, a gallium nitride-based material, or diamond. Thus, the thermal resistance of the semiconductor substrate 10 can be improved. According to the present embodiment, the reliability of the electrodes against a thermal stress can be improved. Thus, by combining the structure of the present embodiment with a semiconductor substrate 10 which is made with a wide band gap semiconductor, the effect of an improvement of the thermal resistance due to the wide band gap semiconductor can be effectively utilized.

These modifications can be applied, as appropriate, to a semiconductor device and a method for manufacturing the semiconductor device according to the following embodiments. Note that the semiconductor device and the method for manufacturing the semiconductor device according to the following embodiments are similar to those of the first embodiment in many respects, and thus differences between the semiconductor device and the method for manufacturing the semiconductor device according to the following embodiments and those of the first embodiment will be mainly described below.

Second Embodiment

Figure 5:
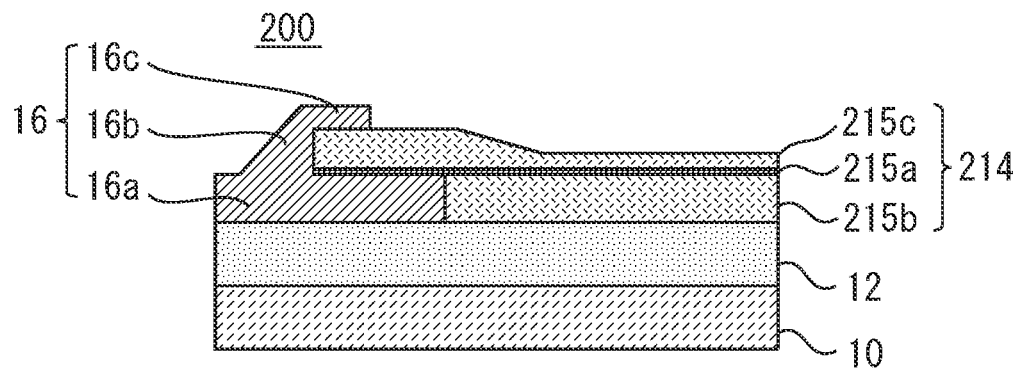
FIG. 5 is a view for describing the structure of a semiconductor device according to a second embodiment.

FIG. 5 is a view for describing the structure of a semiconductor device 200 according to a second embodiment. In FIG. 5, the solder 18, the external electrode 22, and the mold resin 20 are omitted. In the semiconductor device 200, the structure of the second electrode 214 is different from that of the first embodiment. Other configurations are the same as in the first embodiment.

The second electrode 214 includes: a first Ni film 215b that is provided on the upper surface of the first electrode 12, a Ti film 215a that is provided on an upper surface of the first Ni film 215b and a second Ni film 215c that is provided on an upper surface of the Ti film 215a. The second electrode 214 of the present embodiment has a stepped structure formed of a Ni double-layered film.

Figure 6:
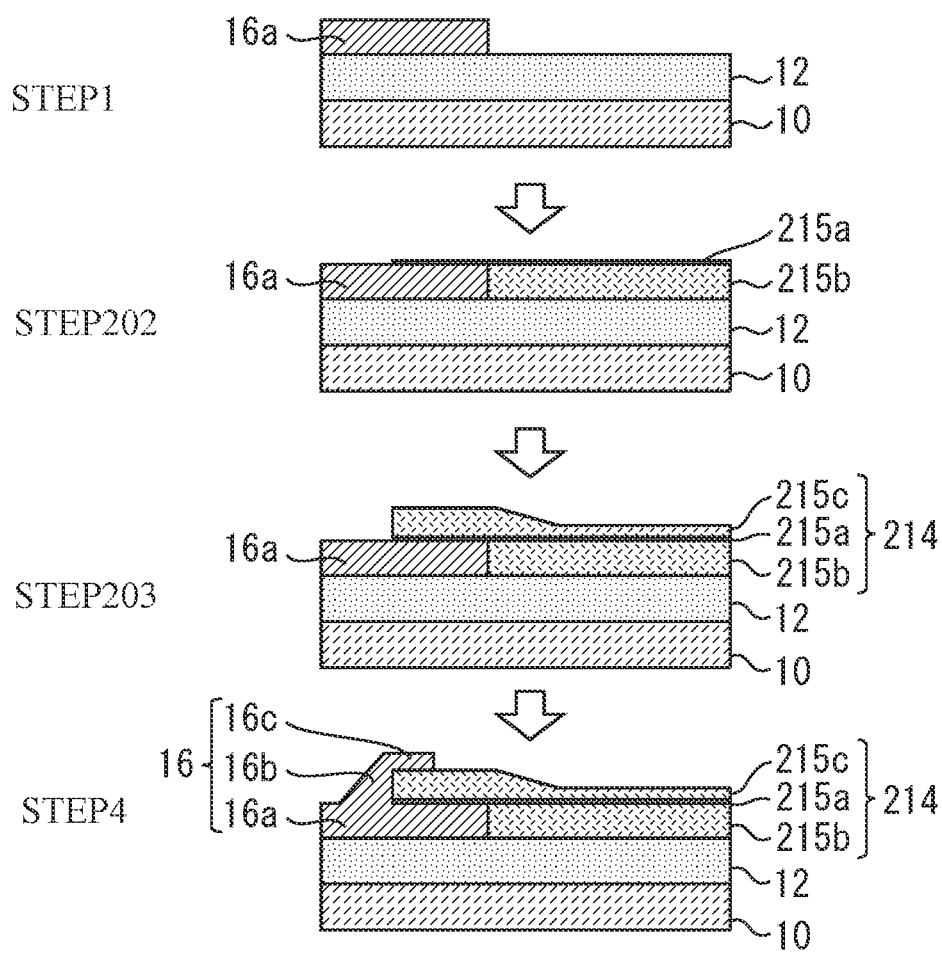
FIG. 6 is a view for describing a manufacturing method of the semiconductor device according to the second embodiment.

FIG. 6 is a view for describing a manufacturing method of the semiconductor device 200 according to the second embodiment. The manufacturing method of the semiconductor device 200 is the same as that of the first embodiment for at and before step 1. Next, an electrode forming step of the present embodiment will be described. First, the first Ni film 215b is formed on an upper surface of the first electrode 12 by plating (step 202). The thickness of the first Ni film 215b which is formed by plating is, for example, 2.0 to 6.0 μm. The first Ni film 215b is formed, for example, to the same height as the first part 16a. Next, the Ti film 215a is formed on the upper surface of the first Ni film 215b by sputtering so as to stretch over the first part 16a and the first Ni film 215b (step 202).

Next, the second Ni film 215c is formed on the upper surface of the Ti film 215a by sputtering (step 203). The second Ni film 215c is formed over from the first Ni film 215b to the first part 16a so as to be larger in area than the first Ni film 215b. The thickness of the second Ni film 215c which is formed by sputtering is, for example, 0.5 to 2.0 μm. Thus, the second electrode 214 is formed over from an upper surface of the first electrode 12 to the upper surface of the first part 16a. The subsequent steps are the same as those of the first embodiment.

Generally, when the thickness of an Ni film is made 2 μm or more by sputtering, the productivity may decrease. On the other hand, in the present embodiment, the first Ni film 215b that is thick is formed by plating on an upper surface of the Al film beforehand. In addition, a Ti/Ni film is formed thereon by sputtering. Thus, the thickness of the Ni film can be ensured while the productivity is ensured. By making the Ni film thick, a stress to the Al film due to a thermal stress can be reduced.

Third Embodiment

Figure 7:
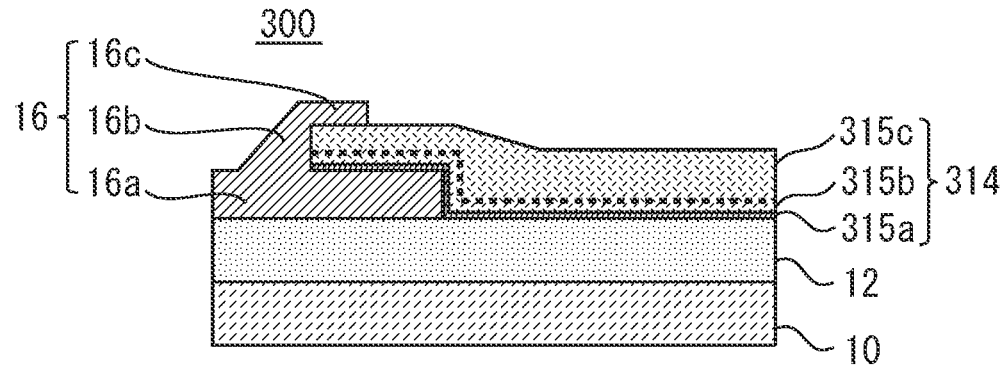
FIG. 7 is a view for describing a structure of a semiconductor device according to a third embodiment.

FIG. 7 is a view for describing a structure of a semiconductor device 300 according to a third embodiment. In FIG. 7, the solder 18, the external electrode 22, and the mold resin 20 are omitted. In the semiconductor device 300, the structure of the second electrode 314 is different from that of the first embodiment. Other configurations are the same as in the first embodiment.

The second electrode 314 includes a Ti film 315a that is provided on the upper surface of the first electrode 12, a first Ni film 315b that is provided on an upper surface of the Ti film 315a and a second Ni film 315c that is provided on an upper surface of the first Ni film 315b. The second electrode 314 of the present embodiment has a stepped structure formed of a Ni double-layered film.

Figure 8:
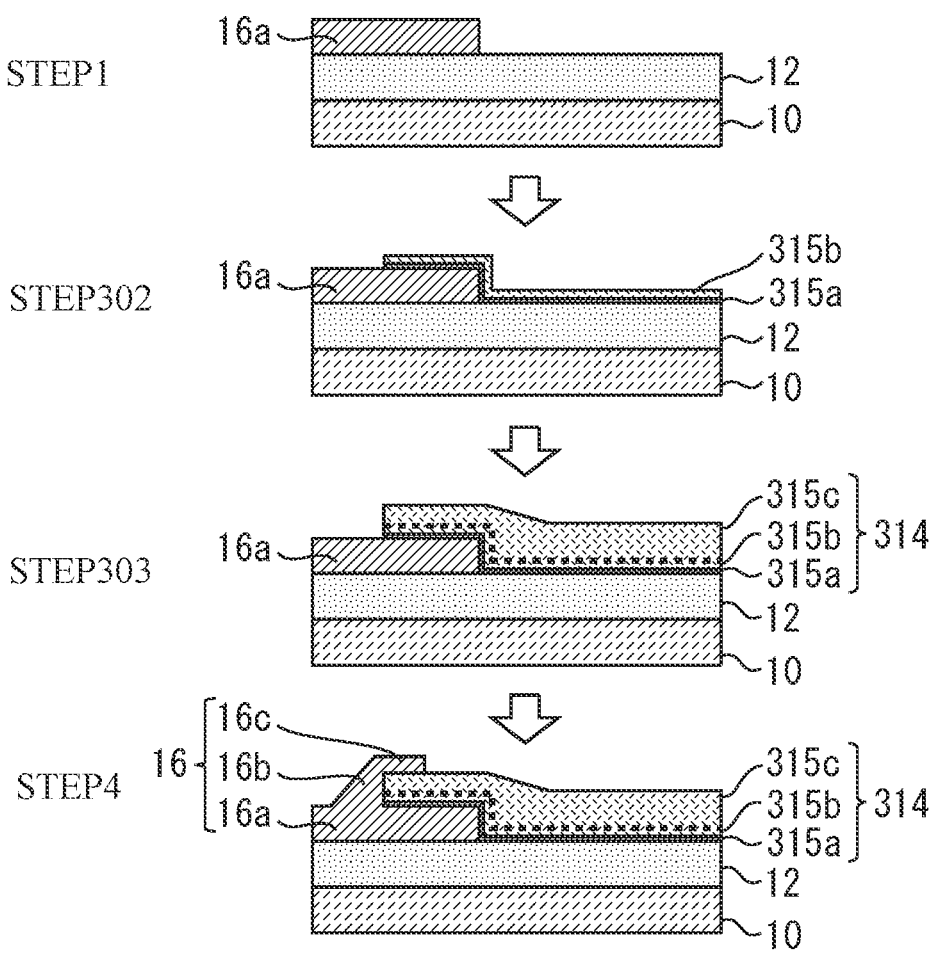
FIG. 8 is a view for describing a manufacturing method of the semiconductor device according to the third embodiment.

FIG. 8 is a view for describing a manufacturing method of the semiconductor device 300 according to the third embodiment. The manufacturing method of the semiconductor device 300 is the same as that of the first embodiment for at and before step 1. Next, an electrode forming step of the present embodiment will be described. First, the Ti film 315a is formed on the upper surface of the first electrode 12 by sputtering so as to stretch over the first part 16a and the first electrode 12 (step 302). Thus, a step difference is formed on the Ti film 315a in an electrode peripheral portion. Next, the first Ni film 315b is formed on an upper surface of the Ti film 315a by sputtering (step 302). Thus, a step difference is formed on the first Ni film 315b in the electrode peripheral portion.

Next, the second Ni film 315c is formed on the upper surface of the first Ni film 315b by plating (step 303). In this way, the second electrode 314 is formed over from the upper surface of the first electrode 12 to the upper surface of the first part 16a. The subsequent steps are the same as those of the first embodiment.

Generally, in sputtering, the thickness and physical property values of the Ni film are easily uniformized than in plating. Therefore, a film quality can be improved. In the present embodiment, a high-quality Ni film is directly formed on the upper surface of the Al film by sputtering and thereby, the effect of protecting the Al film can be improved. Thus, a brittle fracture of the Ni film due to stress concentration caused by a thermal stress can be prevented and the long life of the product can be achieved.

In addition, in a case of forming a Ti/Ni film by sputtering, after an Al film that is the first electrode 12 is formed by sputtering, the Ti/Ni film can be formed on the same manufacturing line. Alternatively, Al/Ti/Ni films can be continuously formed. Therefore, a manufacturing process can be simplified. In addition, by a plating process that follows, the thickness of Ni can be ensured with a good productivity.

Fourth Embodiment

Figure 9:
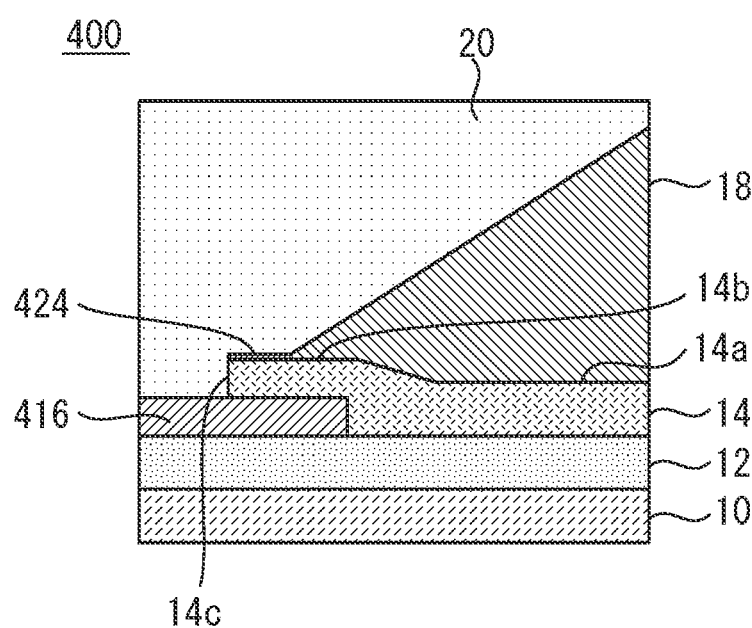
FIG. 9 is a view for describing the structure of a semiconductor device according to a fourth embodiment.

FIG. 9 is a view for describing the structure of a semiconductor device 400 according to a fourth embodiment. In the present embodiment, the structure of an insulating layer 416 is different from that of the first embodiment. The insulating layer 416 does not include the second part 16c and the third part 16b. In addition, on the upper surface of the eaves portion 14b, a conductive film 424 is provided. The conductive film 424 covers a part of the upper surface of the eaves portion 14b, the part being closer to the end portion 14c of the eaves portion 14b than the part covered by the solder 18.

It is harder for the solder 18 to wet and spread on the conductive film 424 than on the second electrode 14. The conductive film 424 is made with, for example, Al. An end portion of the conductive film 424 on a side of the main portion 14a is provided closer to the end portion 14c of the eaves portion 14b than an end portion of the insulating layer 416, the end portion facing the main portion 14a. The end portion of the conductive film 424 on the side of the main portion 14a faces the solder 18 and is in contact with the end portion of the solder 18.

The conductive film 424 has a film quality of hardly causing solder to be attached thereto. Therefore, the conductive film 424 can prevent the solder 18 from wetting and spreading to the end portion 14c of the eaves portion 14b. Thus, the position of the end portion of the solder 18 on the upper surface of the second electrode 14 is determined by the conductive film 424. Therefore, also in the present embodiment, the position of the end portion of the solder 18 and the position of the end portion 14c of the second electrode 14 do not coincide with each other. Thus, even when a crack occurs in the solder 18, the crack is hard to develop to the second electrode.

In addition, directly under the end portion of the solder 18 on the eaves portion 14b, the insulating layer 416 is provided, with the second electrode 14 being interposed between the insulating layer 416 and the end portion under which the first electrode 12 is interposed. This can prevent a crack in the second electrode 14 from propagating to the first electrode 12 that is provided under the insulating layer 416. Thus, the first electrode 12 is protected and the long life of the semiconductor device can be achieved.

In the present embodiment, the securing of a solder bonding area and the prevention of solder flowing can be controlled without polyimide. Therefore, a manufacturing process can be simplified.

Note that the technical features described in the above embodiments may be combined as appropriate.

REFERENCE SIGNS LIST

100, 200, 300, 400 semiconductor device, 10 semiconductor substrate, 12 first electrode, 14, 214, 314 second electrode, 14a main portion, 14b eaves portion, 14c end portion, 15a, 215a, 315a Ti film, 15b Ni film, 16, 416 insulating layer, 16a first part, 16c second part, 16b third part, 18 solder. 215b, 315b first Ni film. 215c, 315c second Ni film, 424 conductive film

The invention claimed is:

1. A semiconductor device, comprising:
a semiconductor substrate;
a first electrode provided on the semiconductor substrate;
an insulating layer including a first part provided on an upper surface of the first electrode;
a second electrode including a main portion and an eaves portion, the main portion being provided on the upper surface of the first electrode, the eaves portion being connected to the main portion and extending over the first part; and
solder covering and directly contacting an upper surface of the main portion and a part of an uppermost surface of the eaves portion connected with the upper surface of the main portion of the second electrode;
wherein
the insulating layer includes:
a second part covering a part of the uppermost surface of the eaves portion, the part being closer to an end of the eaves portion than the part covered by the solder; and
a third part connecting the first part and the second part and covering the end of the eaves portion, and
a length of the second part from the end of the eaves to an end of the second part is shorter than a length of the first part from the end of the eaves portion to an end of the first part.

2. A semiconductor device, comprising:
a semiconductor substrate;
a first electrode provided on the semiconductor substrate;
an insulating layer provided on an upper surface of the first electrode;
a second electrode including a main portion and an eaves portion, the main portion being provided on the upper surface of the first electrode, the eaves portion being connected to the main portion and extending over the insulating layer;
solder covering an upper surface of the main portion and a part of an upper surface of the eaves portion connected with the upper surface of the main portion of the second electrode; and
a conductive film covering a part of the upper surface of the eaves portion, the part being closer to an end portion of the eaves portion than the part covered by the solder, the conductive film on which it is harder for the solder to wet and spread than on the second electrode.

3. The semiconductor device according to claim 2, wherein an end portion of the conductive film on a side of the main portion is provided closer to the end portion of the eaves portion than an end portion of the insulating layer, the end portion of the insulating layer facing the main portion.

4. The semiconductor device according to claim 2, wherein the conductive film is made with Al.

5. The semiconductor device according to claim 1, wherein the second electrode is made with Ni.

6. The semiconductor device according to claim 1, wherein the second electrode includes a Ti film provided on the upper surface of the first electrode and an Ni film provided on an upper surface of the Ti film.

7. The semiconductor device according to claim 1, wherein the second electrode includes a first Ni film provided on the upper surface of the first electrode, a Ti film provided on an upper surface of the first Ni film, and a second Ni film provided on an upper surface of the Ti film.

8. The semiconductor device according to claim 1, wherein the first electrode is made with Al.

9. The semiconductor device according to claim 1, wherein the semiconductor substrate is made with a wide band gap semiconductor.

10. The semiconductor device according to claim 9, wherein the wide band gap semiconductor is silicon carbide, a gallium nitride-based material, or diamond.

11. The semiconductor device according to claim 2, wherein the second electrode is made with Ni.

12. The semiconductor device according to claim 2, wherein the second electrode includes a Ti film provided on the upper surface of the first electrode and an Ni film provided on an upper surface of the Ti film.

13. The semiconductor device according to claim 2, wherein the second electrode includes a first Ni film provided on the upper surface of the first electrode, a Ti film provided on an upper surface of the first Ni film, and a second Ni film provided on an upper surface of the Ti film.

14. The semiconductor device according to claim 2, wherein the first electrode is made with Al.

15. The semiconductor device according to claim 2, wherein the semiconductor substrate is made with a wide band gap semiconductor.

16. The semiconductor device according to claim 15, wherein the wide band gap semiconductor is silicon carbide, a gallium nitride-based material, or diamond.

\* \* \* \* \*